United States Patent
Kimura

(10) Patent No.: US 7,034,562 B2
(45) Date of Patent: Apr. 25, 2006

(54) OSCILLATION DETECTING APPARATUS AND TEST APPARATUS

(75) Inventor: Hiroki Kimura, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/848,895

(22) Filed: May 19, 2004

(65) Prior Publication Data

US 2005/0258855 A1 Nov. 24, 2005

(51) Int. Cl.
*G01R 31/26* (2006.01)
*H03K 5/22* (2006.01)

(52) U.S. Cl. ............ 324/765; 324/158.1; 327/78; 327/18; 331/25; 340/660

(58) Field of Classification Search ........... 324/158.1, 324/750–765; 331/17, 23, 25; 340/660, 340/639.1
See application file for complete search history.

(56) References Cited

U.S. PATENT DOCUMENTS

| | | | | |
|---|---|---|---|---|
| 3,801,799 A | * | 4/1974 | Atkins | 307/116 |
| 3,806,905 A | * | 4/1974 | Strenglein | 340/505 |
| 3,976,940 A | * | 8/1976 | Chau et al. | 714/736 |
| 5,049,838 A | * | 9/1991 | Voyce | 331/11 |
| 5,170,135 A | * | 12/1992 | Ito et al. | 331/1 A |
| 6,819,196 B1 | * | 11/2004 | Lovelace et al. | 331/183 |
| 2003/0184391 A1 | * | 10/2003 | Sekimoto | 331/74 |

FOREIGN PATENT DOCUMENTS

| | | |
|---|---|---|
| JP | 58-52571 | 3/1983 |
| JP | 60-2347 | 1/1985 |
| JP | 63-168866 | 11/1988 |
| JP | 2000-304815 | * 11/2000 |

OTHER PUBLICATIONS

International Search Report dated Aug. 30, 2005 (3 pages).

* cited by examiner

*Primary Examiner*—Vinh Nguyen
*Assistant Examiner*—Emily Y Chan
(74) *Attorney, Agent, or Firm*—Osha-Liang LLP

(57) ABSTRACT

An oscillation detecting apparatus for detecting oscillation of a signal includes a high pass filter for generating an alternating current signal from which a direct current component of the signal is removed, a slicing circuit for generating a limit signal which results from restricting an amplitude level of the alternating current signal to a level lower than a predetermined level, an integration circuit for integrating a waveform of the limit signal during a predetermined period, and a comparator for detecting whether or not the signal oscillates based on a value of the waveform integrated by the integration circuit.

10 Claims, 4 Drawing Sheets

OSCILLATION DETECTING APPARATUS AND TEST APPARATUS

BACKGROUND OF THE INVENTION

1. Field of the Invention

The present invention relates to an oscillation detecting apparatus for detecting the oscillation of a signal and a test apparatus for testing an electronic device.

2. Description of the Related Art

Conventionally, in a test apparatus for testing an electronic device such as a semiconductor circuit, a source power is supplied to the electronic device. In some cases, the power supply voltage may oscillate according to the characteristics of the electronic device connected to the test apparatus as a load. When the power supply voltage oscillates, it is desirable to detect the oscillation of the power supply voltage because there is concern that the test apparatus or the electronic device might be damaged.

A conventional oscillation detecting apparatus includes a filter for removing a direct current component of a given signal, an absolute value circuit for rectifying the signal, an integration circuit for integrating a waveform of the rectified signal and a determination circuit for determining whether or not a signal is in oscillation according to the integration value.

However, the oscillation detecting apparatus of such a configuration may detect the signal, whose amplitude is large, as if it is in oscillation, even though it is not in oscillation, because the integration value of the signal becomes large.

For example, in a test apparatus, when the fluctuation of a signal level is large, e.g. the output of the power supply voltage is started or stopped, the amplitude of the output signal of a filter in the oscillation detecting apparatus becomes large, so that the oscillation detecting apparatus detects the oscillation incorrectly.

SUMMARY OF THE INVENTION

Therefore, it is an object of the present invention to provide an oscillation detecting apparatus and a test apparatus, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, an oscillation detecting apparatus for detecting oscillation of a signal includes a high pass filter for generating an alternating current signal from which a direct current component of the signal is removed, a slicing circuit for generating a limit signal which results from restricting an amplitude level of the alternating current signal to a level lower than a predetermined level, an integration circuit for integrating a waveform of the limit signal during a predetermined period, and a comparator for detecting whether or not the signal oscillates based on a value of the waveform integrated by the integration circuit.

The oscillation detecting apparatus may further include an absolute value circuit for converting a negative signal component of the alternating current signal into a positive signal component. The oscillation detecting apparatus may further include an absolute value circuit for converting a negative signal component of the limit signal into a positive signal component.

According to the second aspect of the present invention, a test apparatus for testing an electronic device include a power supply unit for supplying a power supply voltage to the electronic device, an oscillation detecting apparatus for detecting oscillation of the power supply, and a warning unit for giving a warning when the power supply voltage is oscillating, wherein the oscillation detecting apparatus includes the high pass filter for generating an alternating current signal from which a direct current component of the signal is removed, the slicing circuit for generating a limit signal which results from restricting an amplitude level of the alternating current signal to a level lower than a predetermined limit level, the integration circuit for integrating a waveform of the limit signal during the predetermined period, and the comparator for detecting whether or not the power supply voltage oscillates based on a value of the waveform integrated by the integration circuit.

The test apparatus may further include an absolute value circuit for converting a negative signal component of the alternating current signal into a positive signal component. The test apparatus may further include an absolute value circuit for converting a negative signal component of the limit signal into a positive signal component.

The high pass filter may pass a signal component of a natural oscillation frequency band of the power supply unit. The limit level of the slicing circuit may be larger than an oscillation amplitude level permitted in the power supply unit.

The warning unit may stop the power supply unit from operating when an oscillation of the power supply voltage is detected by the comparator. The comparator may be provided with a plurality of different reference values and determine a degree of danger of the oscillation of the power supply voltage by comparing the plurality of reference values with the value of the limited signal integrated by the integration circuit.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
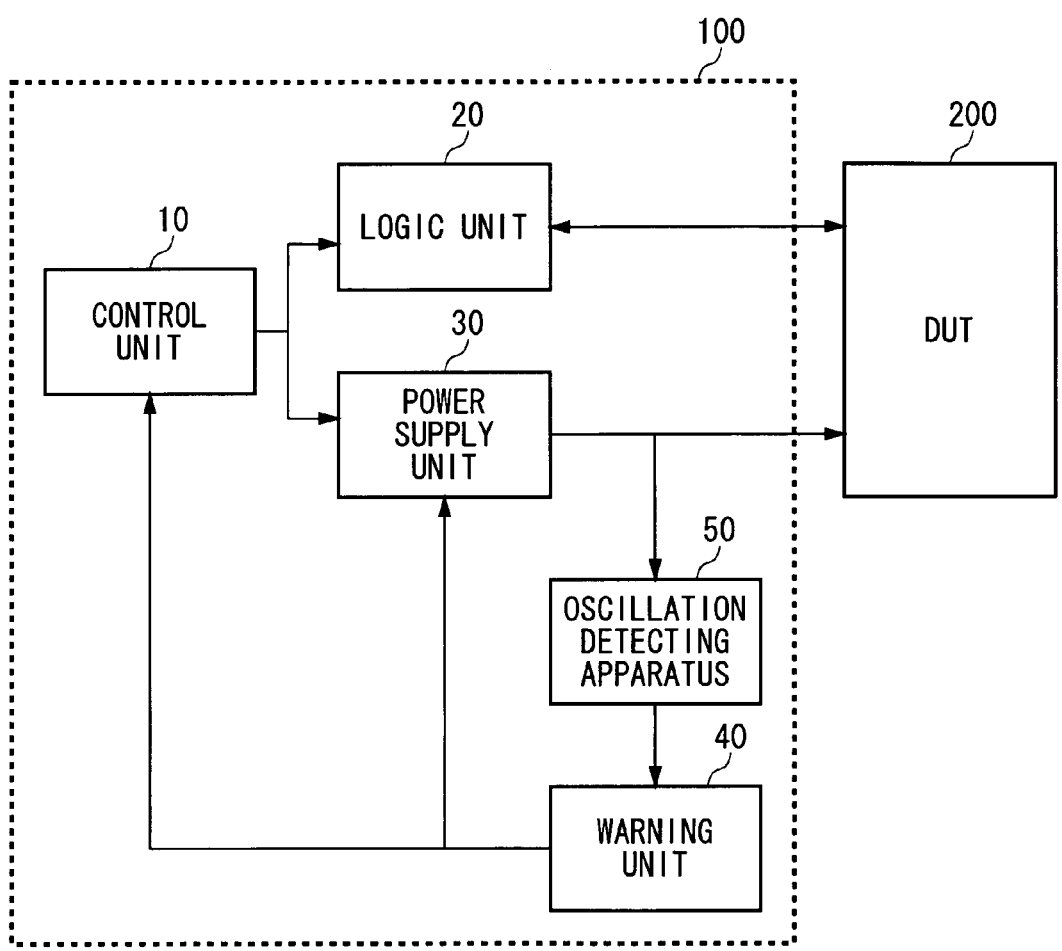
FIG. 1 shows an example of the configuration of a test apparatus 100 according to an embodiment of the present invention.

FIG. 1 shows an example of the configuration of a test apparatus 100 according to an embodiment of the present invention. The test apparatus 100 for testing an electronic device 200 such as a semiconductor circuit includes a control unit 10, a logic unit 20, a power supply unit 30, a warning unit 40, and an oscillation detecting apparatus 50.

The logic unit 20 inputs a test pattern for the test of the electronic device 200 into the electronic device 200 and determines pass or fail of the electronic device based on an output signal outputted from the electronic device 200.

The power supply unit 30 provides the electronic device 200 with a power supply voltage and a power supply current for driving the electronic device 200. In this example, the test apparatus 100 has the configuration to perform the logic test of the electronic device 200, but in other examples, the test apparatus 100 may perform a DC test to measure the power supply voltage and the source power supplied to the electronic device 200.

The oscillation detecting apparatus 50 detects the oscillation of a given signal. In this example, the oscillation detecting apparatus 50 detects the oscillation of the power supply voltage that the power supply unit 30 supplies to the electronic device 200.

The warning unit 40 warns the control unit 10 when the power supply voltage is in oscillation. Moreover, the warning unit 40 may stop the operation of the power supply unit 30, when the oscillation of the power supply voltage is detected. In this case, it is desirable that the warning unit 40 informs the control unit 10 that it stops the operation of the power supply unit 30 because the power supply voltage is in oscillation.

Figure 2:
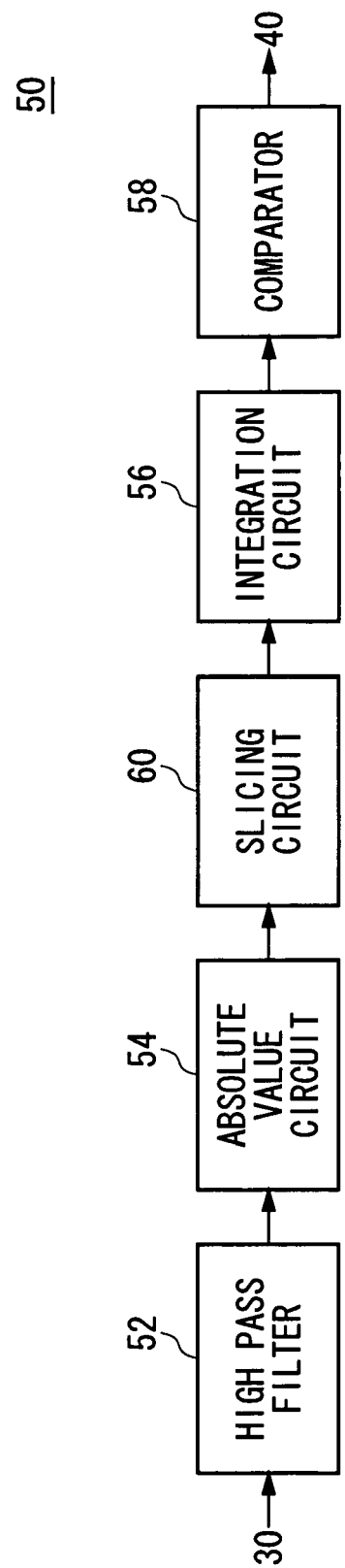
FIG. 2 shows an exemplary configuration of an oscillation detection apparatus 50.

FIG. 2 shows an exemplary configuration of the oscillation detecting apparatus 50. The oscillation detecting apparatus 50 includes a high pass filter 52, an absolute value circuit 54, a slicing circuit 60, an integration circuit 56 and a comparator 58.

The high pass filter 52 generates an alternating current signal from which the direct current of the power supply voltage, which is to be supplied to the electronic device 200 by the power supply unit 30, is removed. It is desirable that the high pass filter 52 should pass the signal component of the natural oscillation frequency band of the power supply unit 30. Here, the natural oscillation frequency is, for example, an oscillation frequency determined by the characteristics of the circuit elements included in the power supply unit 30.

The absolute value circuit 54 rectifies the alternating current signal. In other words, the absolute value circuit 54 converts the negative signal component of the alternating current signal into a positive signal component. The slicing circuit 60 generates a limit signal which results from restricting the amplitude level of the alternating current signal to a level lower than the predetermined limit level. In other words, the slicing circuit 60 replaces a signal component, which is larger than the limit level of the alternating current signal, with the signal component of the limit level. The slicing circuit 60 may be provided with the limit level larger than the oscillation amplitude level permitted in the power supply unit 30 as the limit level.

Moreover, although the absolute value circuit 54 is provided on the upstream of the slicing circuit 60 in this example, the absolute value circuit 54 may be provided on the downstream of the slicing circuit 60 in other examples. In this case, the slicing circuit 60 converts the negative signal component of the limit signal outputted from the slicing circuit 60 into a positive signal component.

The integration circuit 56 integrates the waveform of the limit signal during a predetermined period. The comparator 58 detects whether or not the power supply voltage is in oscillation based on the integration value of the waveform integrated by the integration circuit 56.

Figure 3:
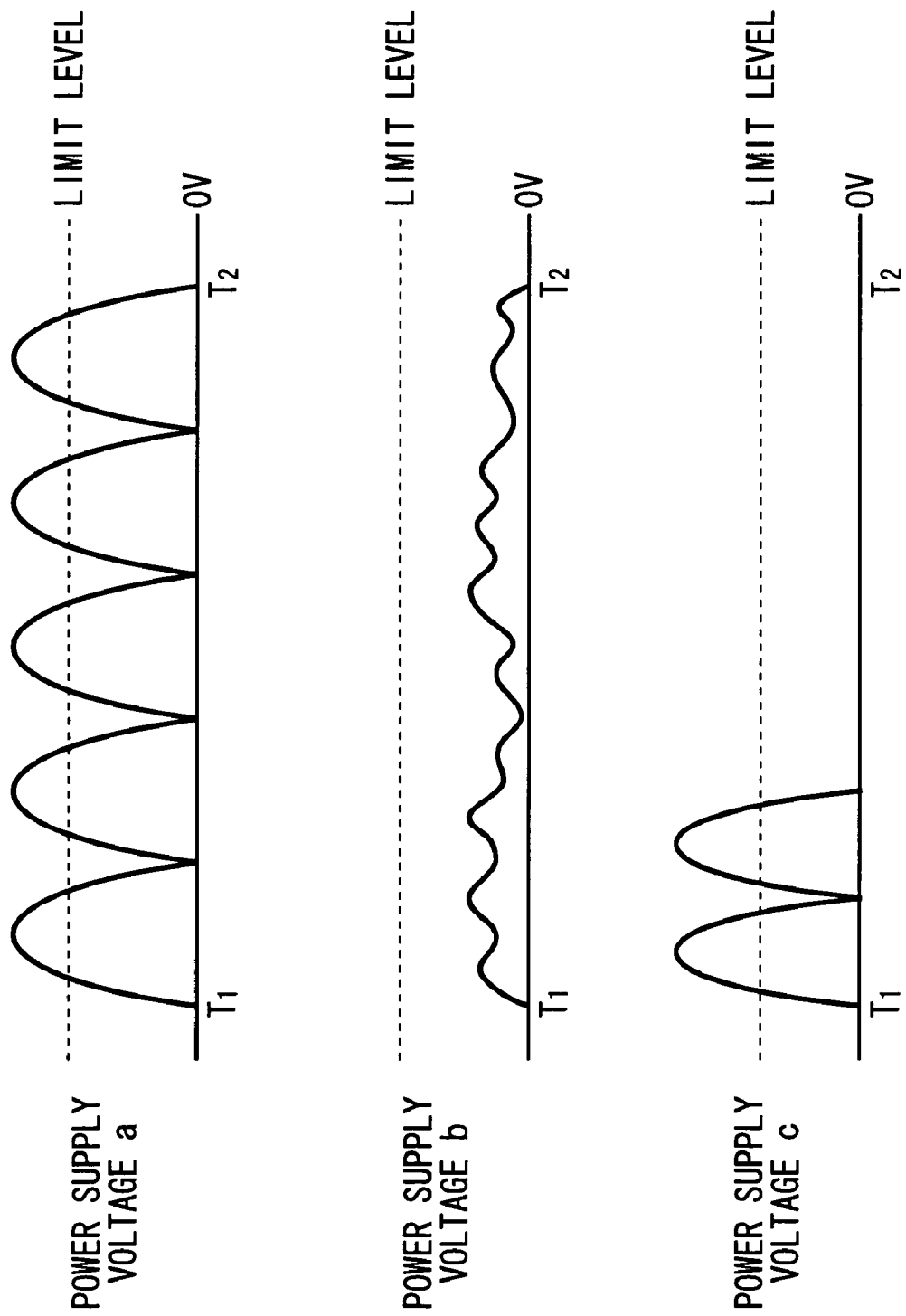
FIG. 3 shows an exemplary configuration of a waveform of an alternating current component of a rectified power supply voltage.

FIG. 3 shows an example of a waveform of the alternating current component of the power supply voltage rectified. According to this example, the integration circuit 56 integrates the waveform of the power supply voltage during the predetermined period from T1 to T2.

When the power supply voltage is in oscillation, the waveform shown by the power supply voltage a in FIG. 3 is supplied to the slicing circuit. As above, the oscillation detecting apparatus 50 removes a signal component larger than the limit level and integrates the waveform.

The comparator 58 is supplied with the reference value according to both the amplitude of the oscillation signal to be detected and the integration time (T1 to T2). For example, when the oscillation signal whose amplitude damages the power supply unit 30 is detected, the integration value, which results from integrating the oscillation signal of the minimum amplitude that damages the power supply unit 30 during the integration time (T1 to T2), is provided as the reference value.

The comparator 58 considers the power supply voltage to be in oscillation when the integration value outputted from the integration circuit 56 is larger than the predetermined reference value. According to such operation, when the power supply voltage oscillates at the amplitude level larger than the amplitude level of the oscillation permitted in the power supply unit 30, the oscillation can be detected. For this reason, it is possible to prevent the power supply unit 30 from being damaged. Further, the incorrect detection of the oscillation can be prevented when the amplitude of the power supply voltage fluctuates according to the oscillation, noise and the like of a small amplitude permitted in the power supply unit 30.

Moreover, a plurality of different reference values are supplied to the comparator 58, and the degree of danger of the oscillation of the power supply voltage may be determined by comparing the plurality of reference values with the integration value integrated by the integration circuit 56. It is desirable that the warning unit 40 should notify the control unit 10 and stop the operation of the power supply unit 30 according to the degree of danger determined by the comparator 58.

For example, when the amplitude of the power supply voltage is substantially equal to the limit level, the comparator 58 is provided with a first reference value which is the integration value of the waveform and a second reference value which is smaller than the first reference value. In the integration circuit 56, when the integration value is larger than the second reference value, the integration circuit 56 notifies the control unit 10. When the integration value is larger than the first reference value, the integration circuit 56 may stop the operation of the power supply unit 30.

Further, when the power supply voltage is not in oscillation, the noise waveform shown by the power supply voltage b in FIG. 3 is supplied to the slicing circuit 60. The integration value of the integration circuit 56 becomes smaller than the reference value which is supplied to comparator 58. For this reason, the oscillation detecting circuit 50 considers the power supply voltage not to be in oscillation.

In addition, when the level of the power supply voltage fluctuates steeply, as shown by the power supply voltage c in FIG. 3, the waveform including a signal component of a large amplitude at the phase of the fluctuation is supplied to the slicing circuit 60. In that case, when the waveform is integrated as it is, the integration value becomes larger than the reference value supplied to the comparator 58, so that the oscillation may be detected incorrectly. Although the incorrect detection can be prevented by taking a long integration time (T1~T2) and providing a large reference value in response to the long integration time (T1~T2), it is not desirable because the measuring time becomes long.

However, in this example, since the oscillation detecting apparatus 50 restricts the amplitude level by means of the slicing circuit 60 and cuts the large amplitude of the signal component, it is possible to prevent the incorrect detection, where a signal of a large amplitude temporarily occurring is detected as an oscillation signal, and perform the measurement in short time.

Moreover, it is desirable that the limit level supplied to the slicing circuit 60 should be larger than the amplitude level of the oscillation signal which is detectable according to the reference value supplied to the comparator 58. By setting the limit level in that way, it is possible to maintain the detection sensitivity of the oscillation signal and reduce the incorrect detection.

Although the detection sensitivity indicating the degree of the amplitude of the oscillation which is detectable can be adjusted by controlling the reference value supplied to the comparator 58, alternatively, the reference value supplied to the comparator 58 may be fixed, so that the detection sensitivity can be controlled by adjusting the amplitude gain of the high pass filter in other examples.

Figure 4:
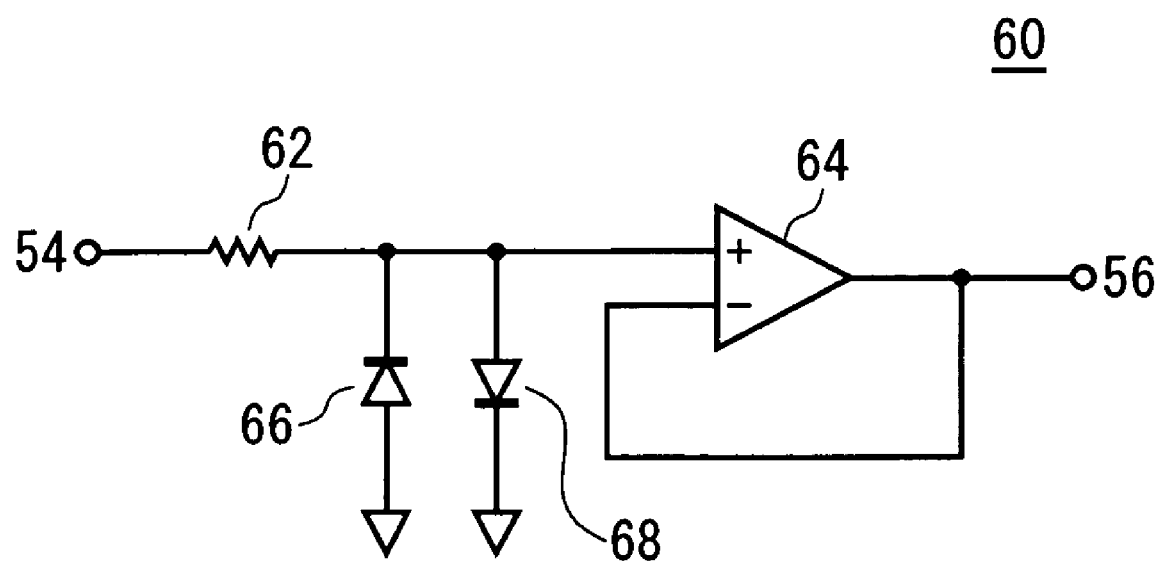
FIG. 4 shows an exemplary configuration of a slicing circuit 60.

FIG. 4 shows an exemplary configuration of the slicing circuit 60. In this example, the absolute value circuit 54 (see FIG. 2) is provided on the downstream of the slicing circuit 60. The slicing circuit 60 includes a resistor 62, a diode 66, a diode 68, and a differential amplifier 64. The positive and negative amplitudes of the alternating current signal supplied via the resistor 62 are restricted by both the diodes 66 and 68, and the differential amplifier 64 outputs the alternating current signal whose amplitude is limited.

Moreover, when the absolute value circuit 54 is provided on the upstream of the slicing circuit 60, the alternating current signal supplied to the slicing circuit 60 has only the positive amplitude. Accordingly, the slicing circuit 60 can restrict the amplitude of the alternating current signal by means of one diode. In this case, the circuit size of the slicing circuit 60 can be reduced.

The configuration of the slicing circuit 60 is not limited to the configuration described in connection with FIG. 4. The circuit with other various configurations can be used as the slicing circuit 60.

As obvious from the above description, according to the present invention, it is possible to reduce the incorrect detection of the oscillation of the signal and detect the oscillation of the signal efficiently.

Although the present invention has been described by way of exemplary embodiments, it should be understood that those skilled in the art might make many changes and substitutions without departing from the spirit and the scope of the present invention which is defined only by the appended claims.

What is claimed is:

1. An oscillation detecting apparatus for detecting oscillation of a signal, comprising:
    a high pass filter for generating an alternating current signal from which a direct current component of said signal is removed;
    a slicing circuit for generating a limit signal which results from restricting an amplitude level of said alternating current signal to a level lower than a predetermined level sufficient to reduce an incorrect detection of the oscillation of the signal;
    an integration circuit for integrating a waveform of said limit signal during a predetermined period; and
    a comparator for detecting whether or not said signal oscillates based on a value of said waveform integrated by said integration circuit.

2. An oscillation detecting apparatus as claimed in claim 1 further comprising an absolute value circuit for converting a negative signal component of said alternating current signal into a positive signal component.

3. An oscillation detecting apparatus as claimed in claim 1 further comprising an absolute value circuit for converting a negative signal component of said limit signal into a positive signal component.

4. A test apparatus for testing an electronic device, comprising:
    a power supply unit for supplying a power supply voltage to said electronic device;
    an oscillation detecting apparatus for detecting oscillation of said power supply; and
    a warning unit for giving a warning when said power supply voltage is oscillating,
    wherein said oscillation detecting apparatus comprises:
        a high pass filter for generating an alternating current signal from which a direct current component of said signal is removed;
        a slicing circuit for generating a limit signal which results from restricting an amplitude level of said alternating current signal to a level lower than a predetermined limit level sufficient to reduce an incorrect detection of the oscillation of the signal;
        an integration circuit for integrating a waveform of said limit signal during said predetermined period; and
        a comparator for detecting whether or not said power supply voltage oscillates based on a value of said waveform integrated by said integration circuit.

5. A test apparatus as claimed in claim 4 further comprising an absolute value circuit for converting a negative signal component of said alternating current signal into a positive signal component.

6. A test apparatus as claimed in claim 4 further comprising an absolute value circuit for converting a negative signal component of said limit signal into a positive signal component.

7. A test apparatus as claimed in claim 4, wherein said high pass filter passes a signal component of a natural oscillation frequency band of said power supply unit.

8. A test apparatus as claimed in claim 4, wherein said limit level of said slicing circuit is larger than an oscillation amplitude level permitted in said power supply unit.

9. A test apparatus as claimed in claim 4, wherein said warning unit stops said power supply unit from operating when an oscillation of said power supply voltage is detected by said comparator.

10. A test apparatus as claimed in claim 4, wherein said comparator is provided with a plurality of different reference values and determines a degree of danger of said oscillation of said power supply voltage by comparing said plurality of reference values with sale value of said limited signal integrated by said integration circuit.

* * * * *